US010367408B2

(12) United States Patent
Harrison

(10) Patent No.: US 10,367,408 B2
(45) Date of Patent: Jul. 30, 2019

(54) ELECTROMAGNETIC COMPATIBILITY FILTER WITH AN INTEGRATED POWER LINE COMMUNICATION INTERFACE

(71) Applicant: Enphase Energy, Inc., Petaluma, CA (US)

(72) Inventor: Michael Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 838 days.

(21) Appl. No.: 14/445,680

(22) Filed: Jul. 29, 2014

(65) Prior Publication Data

US 2015/0029766 A1 Jan. 29, 2015

Related U.S. Application Data

(60) Provisional application No. 61/859,482, filed on Jul. 29, 2013.

(51) Int. Cl.
*H02M 1/15* (2006.01)
*H02M 1/12* (2006.01)
*H03H 7/42* (2006.01)

(52) U.S. Cl.
CPC ............ *H02M 1/126* (2013.01); *H02M 1/15* (2013.01); *H02M 2001/123* (2013.01); *H03H 7/427* (2013.01)

(58) Field of Classification Search
CPC .. H02M 2001/123; H02M 1/15; H02M 1/126; H03H 7/427
USPC .. 363/17–19, 21.12–21.17, 40, 44, 49, 56.1, 363/56.11, 123; 375/219, 285, 254, 343, 375/295–297, 479
See application file for complete search history.

(56) References Cited

U.S. PATENT DOCUMENTS

| 5,555,494 A | * | 9/1996 | Morris | H02M 3/337 363/132 |
| 6,177,849 B1 | * | 1/2001 | Barsellotti | H04B 3/56 333/177 |
| 6,208,098 B1 | * | 3/2001 | Kume | H02M 1/126 318/400.25 |

(Continued)

FOREIGN PATENT DOCUMENTS

| JP | 2004-248118 | 9/2004 |
| JP | 2008-227837 | 9/2008 |
| KR | 10-2008-0060713 | 7/2008 |

OTHER PUBLICATIONS

International Search Report and Written Opinion dated Nov. 12, 2014 for Application No. PCT/US2014/048457, 11 pgs.

*Primary Examiner* — Matthew V Nguyen
*Assistant Examiner* — Nusrat Quddus
(74) *Attorney, Agent, or Firm* — Moser Taboada

(57) ABSTRACT

An embodiment of the present invention is directed to an integrated electromagnetic compatibility (EMC) filter and power line communication (PLC) interface. The EMC filter and PLC interface comprises a first filter winding and a second filter winding configured as a common mode choke; and a two-part winding on the common mode choke, wherein the two-part winding comprises (i) a first winding coupled proximate the first filter winding and (ii) a second winding coupled proximate the second filter winding, wherein the first winding and the second winding have an equal number of turns, and wherein phasing of the first winding is reversed with respect to the second winding.

20 Claims, 3 Drawing Sheets

(56) References Cited

U.S. PATENT DOCUMENTS

| | | | |
|---|---|---|---|
| 6,667,685 B2* | 12/2003 | Wasaki | H04B 3/56 340/12.34 |
| 7,423,520 B2 | 9/2008 | Wasaki et al. | |
| 2003/0031035 A1* | 2/2003 | Kitano | H02M 1/12 363/49 |
| 2004/0017689 A1* | 1/2004 | Zhang | H02M 5/45 363/71 |
| 2005/0286270 A1* | 12/2005 | Petkov | H01F 27/38 363/17 |
| 2006/0220772 A1* | 10/2006 | Suzuki | H03H 7/427 336/69 |
| 2011/0032731 A1* | 2/2011 | Coleman | H02M 1/4258 363/21.12 |
| 2012/0187768 A1 | 7/2012 | Goder et al. | |
| 2013/0135903 A1* | 5/2013 | Fu | H02M 3/3374 363/17 |
| 2014/0268933 A1* | 9/2014 | Zhou | H02M 1/12 363/44 |

* cited by examiner

ELECTROMAGNETIC COMPATIBILITY FILTER WITH AN INTEGRATED POWER LINE COMMUNICATION INTERFACE

CROSS-REFERENCE TO RELATED APPLICATIONS

This application claims benefit of U.S. provisional patent application Ser. No. 61/859,482, entitled "EMC FILTER WITH AN INTEGRAL PLC INTERFACE" and filed Jul. 29, 2013, which is herein incorporated in its entirety by reference.

BACKGROUND OF THE INVENTION

Field of the Invention

Embodiments of the present disclosure relate generally to power conversion, and, in particular, to integrating an electromagnetic compatibility (EMC) filter with a power line communication (PLC) interface.

Description of the Related Art

DC-AC inverters are often used to convert DC power to AC power that is coupled to a commercial power grid. In order to couple the generated AC power to the grid, the inverter must meet relevant standards such as those for electromagnetic compatibility (EMC). An inverter may comprise a suitable filter for filtering the generated AC power to meet the EMC standards.

Some inverters employ power line communication (PLC) for communicating data over the grid. Inverters employing PLC may use a transformer for coupling the PLC signal to/from the AC output. Both the EMC filter as well as the PLC transformer consume a significant amount of physical space within the inverter and tend to contribute to a higher overall cost in producing the inverter.

Therefore, there is a need in the art for an apparatus for integrating the filtering of AC output power and the coupling of a PLC signal to the AC output while reducing the size and cost of production for the inverter.

SUMMARY OF THE INVENTION

Embodiments of the present invention generally relate to an EMC filter with an integral PLC interface substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
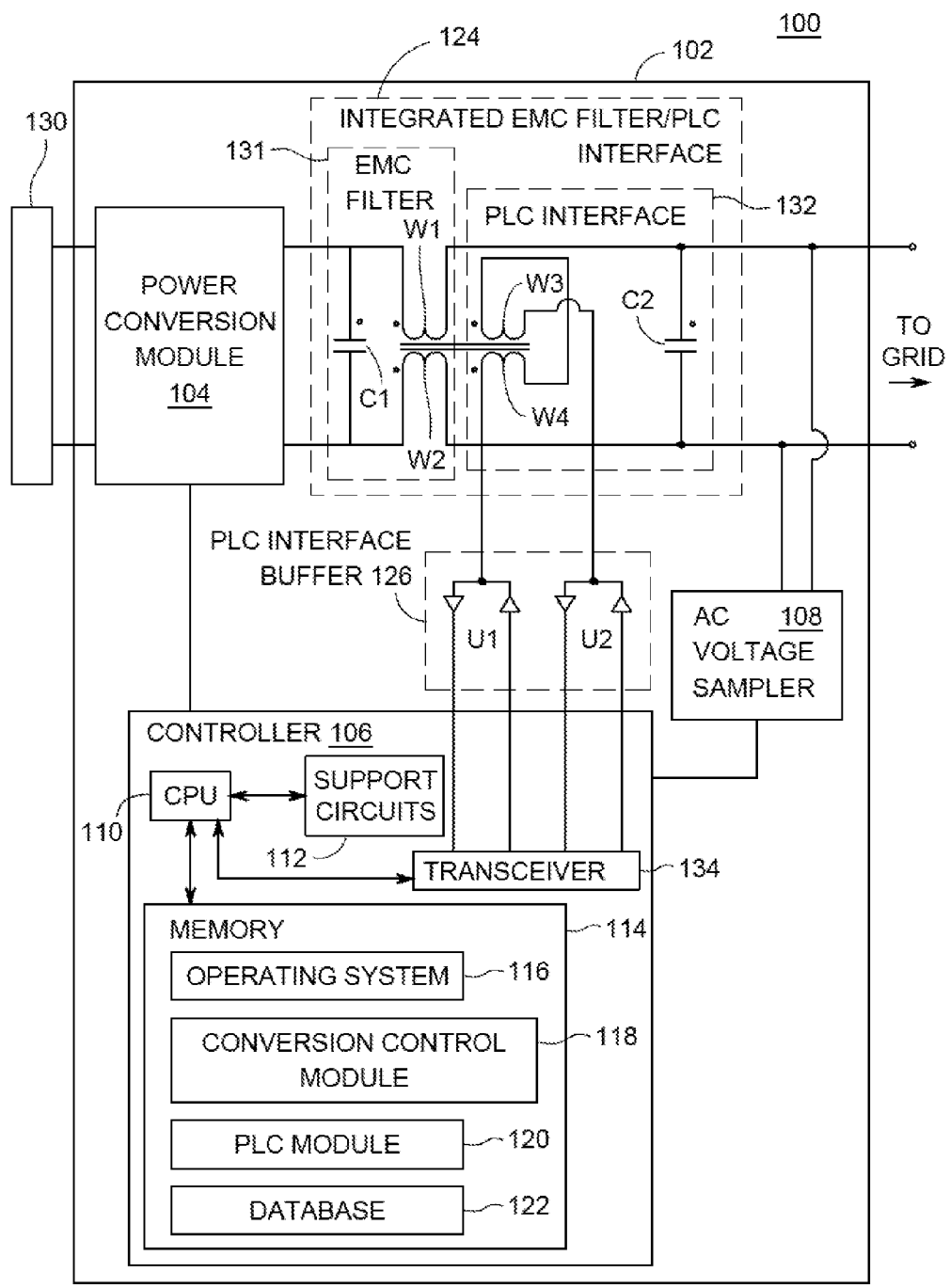
FIG. 1 is a functional block diagram of a power generation system in accordance with one or more embodiments of the present invention.

FIG. 1 is a functional block diagram of a power generation system 100 in accordance with one or more embodiments of the present invention. The system configuration illustrated in FIG. 1 is one exemplary embodiment of a myriad of possible system configurations. Those of ordinary skill in the art will recognize that other configurations are possible while still remaining within the purview of the present invention. The present invention can function in a variety of power generation environments and systems.

The power generation system 100 comprises one or more DC power sources 130 coupled across a DC-AC inverter 102. The DC power sources 130 may be any suitable source of DC power, such as a renewable source (e.g., one or more of photovoltaic (PV) modules, wind farms, hydroelectric systems, or the like), batteries, or the like. The inverter 102 converts the DC power to commercial power grid compliant AC output power and couples the generated output power to the commercial power grid ("the grid"). The generated output power may also be stored for later use, for example, using batteries, heated water, hydro pumping, $H_2O$-to-hydrogen conversion, or the like.

The inverter 102 comprises a power conversion module 104 coupled across the input of an integrated EMC filter/PLC interface 124. The integrated electromagnetic compatibility (EMC) filter and power line communication (PLC) interface 124 is coupled to a PLC interface buffer 126 and across the AC output of the inverter 102, and an AC voltage sampler 108 is coupled across the output of the integrated EMC filter/PLC interface 124. Each of the power conversion module 104, the PLC interface buffer 126, and the AC voltage sampler 108 is coupled to a controller 106.

The power conversion module 104 is controlled by the controller 106 and converts a DC input from the DC power sources 130 to AC power that is coupled to the inverter AC output via the integrated EMC filter/PLC interface 124. The AC voltage sampler 108 is coupled, via the integrated EMC filter/PLC interface 124, across both output terminals of the power conversion module 104. The AC voltage sampler 108 measures the AC voltage at the output of the power conversion module 104, and provides samples of the measured voltage (e.g., digital samples) to the controller 106. The controller 106 uses the voltage samples for controlling the power conversion module 104 (for example, for synchronizing the generated AC output power to the commercial power grid). The AC voltage sampler 108 may obtain such samples at a rate of, for example, 100 kHz, and may comprise an optional A/D converter (not shown) for obtaining the voltage samples.

The controller 106 may be comprised of hardware, software, or a combination thereof, and comprises at least one central processing unit (CPU) 110 coupled to support circuits 112, transceiver 134 and memory 114. The CPU 110 may comprise one or more conventionally available microprocessors, microcontrollers and the like, which are capable of performing the processing described herein; in some embodiments, the CPU 110 may be a microcontroller comprising internal memory for storing controller firmware that provides the functionality described herein. Alternatively, the CPU 110 may include one or more application specific integrated circuits (ASICs). The support circuits 112 are well known circuits that facilitate the functionality of the CPU 110. Such circuits include, but are not limited to, a cache, power supplies, clock circuits, buses, network cards, input/output (I/O) circuits, and the like. According to some embodiments, the controller 106 is implemented using a general purpose computer that, when executing particular software, becomes a specific purpose computer for performing various embodiments of the present invention. The transceiver 134 is coupled to the PLC interface buffer 126 for PLC communication.

According to some embodiments, the memory 114 comprises random access memory, read only memory, removable disk memory, flash memory, and various combinations of these types of memory. The memory 114 is sometimes referred to as main memory and may, in part, be used as cache memory or buffer memory. The memory 114 generally stores the operating system (OS) 116 of the controller 106. The OS 116 may be one of a number of commercially available OSs such as, but not limited to, Linux, Real-Time Operating System (RTOS), and the like.

The memory 114 may store various forms of application software, such as a conversion control module 118 for providing operative control of the power conversion module 104 and driving the power conversion module 104 to inject the generated AC current into the grid as required by the relevant standards. The memory 114 further stores a power line communication (PLC) module 120 for enabling power line communications over a commercial power grid. The memory 114 further stores a database 122 for storing data, such as data related to operating the power conversion module 104, power line communications, and the like.

The integrated EMC filter/PLC interface 124 comprises a capacitor C1 coupled across first terminals of windings W1 and W2 on a common mode choke which are further coupled at second terminals across a capacitor C2 to form an EMC filter 131. The EMC filter 131 provides common mode filtering where electromagnetic interference noise is suppressed by filtering in accordance with relevant standards by filtering out common-mode currents, i.e., those currents flowing in the same direction. The EMC filter windings W1 and W2 are coupled such that the magnetic flux generated by the current flowing through W1 cancels the magnetic flux generated to the return current that flows through winding W2 (i.e., the windings W1 and W2 form a common mode choke). The integrated EMC filter/PLC interface 124 further comprises an additional winding on the common mode choke, wound in two parts (W3 and W4), that provides a PLC interface 132 for power line communication via the inverter AC output. Winding W3 (i.e., a first winding of the two-part winding) is wound in close proximity to winding W1, and winding W4 (i.e., a second winding of the two-part winding) is wound in close proximity to winding W2. According to one embodiment, the windings W3 and W1, and W2 and W4 are wound in a "bi-filar" manner, i.e., only the insulation thickness on the windings would be separating the windings. The number of turns on each of these half-winding W3 and W4 is equal; however the phasing of one of these half-windings is reversed with respect to the other. In contrast to the EMC filter 131, the PLC interface windings W3 and W4 are coupled such that the magnetic flux generated by each winding (W3 & W4) flows in the same direction through the magnetic core—i.e., a "differential mode" wiring configuration. Thus, the EMC filter 131 of the integrated EMC filter/PLC interface 124 is configured as a common mode EMC filter choke, while the PLC windings of the integrated EMC filter/PLC interface 124 are configured in a differential mode configuration.

The number of turns for each of windings W1 and W2 (i.e., the number of turns on each of the two windings of the EMC filter 131), which are equal to one another, may vary depending on the size of the inverter 102 and the switching frequency employed, but generally are between 10 turns to 100 turns. The number of turns for each of windings W3 and W4 (i.e., the number of turns on each of the two windings for the PLC interface 132), which are equal to one another, may be similar, in some embodiments, to the number of turns for windings W1 and W2 (e.g., from 10 to 100) but are not required to be. The relative ratio of the number of turns for the EMC filter 131 and the PLC interface 132 can be independently adjusted according to the independent needs borne out of EMC filter performance and PLC signaling performance.

The two ends of the additional windings W3 and W4 are coupled to the PLC interface buffer 126 which comprises two bi-directional buffers U1 and U2, i.e., the end of winding W4 is coupled to the bidirectional buffer U1, and the end of W3 is coupled to the bi-directional buffer U2. The PLC interface buffer 126 can drive PLC communication or alternatively receive PLC communication via the grid.

In some embodiments, the PLC interface buffer 126 is referenced to ground of the inverter 102. In such embodiments, if the common-mode choke windings W1 and W2 are enamel insulated "magnet wire", a safety-rated isolation is employed between the windings W3 and W4 and the windings W1 and W2, such as using "triple insulated wire" for the winding W3 and W4.

Figure 2:
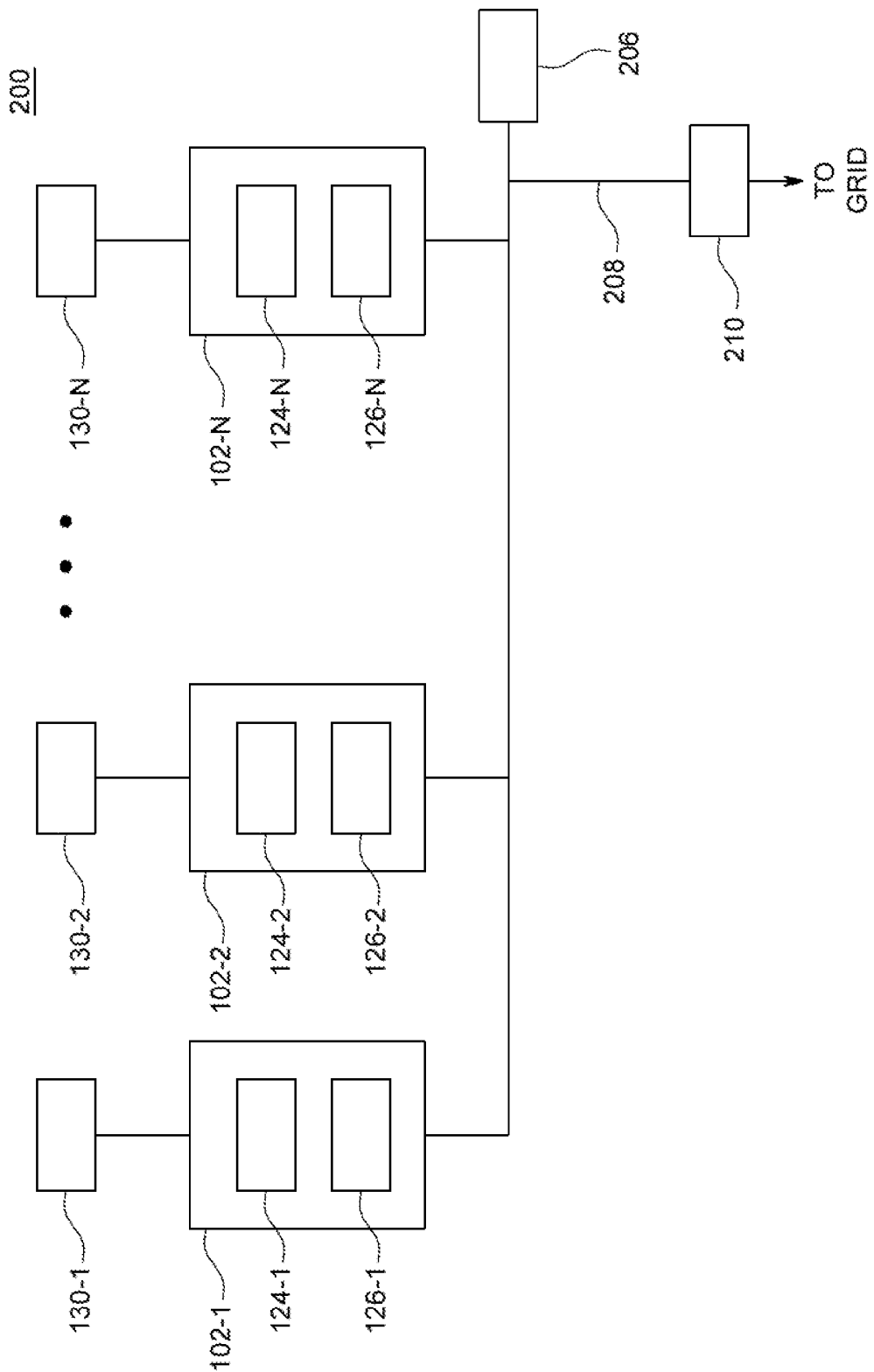
FIG. 2 is a block diagram of a system for power conversion using one or more embodiments of the present invention.

FIG. 2 is a block diagram of a system 200 for power conversion using one or more embodiments of the present invention. This diagram only portrays one variation of the myriad of possible system configurations and devices that may utilize the present invention. The present invention can be utilized in any system or device requiring EMC filtering as well as PLC.

The system 200 comprises a plurality of inverters 102-1, 102-2 . . . 102-N, collectively referred to as inverters 102; a plurality of DC power sources 130-1, 130-2 . . . 130-N, collectively referred to as DC power sources 130; a main controller 206; a bus 208; and a load center 210.

Each inverter 102-1, 102-2 . . . 102-N is coupled to a DC power source 130-1, 130-2 . . . 130-N, respectively, in a one-to-one correspondence; in some alternative embodiments, multiple DC power sources 130 may be coupled to a single inverter 102. The inverters 102 are coupled to the main controller 206 via the bus 208. The main controller 206 is capable of communicating with the inverters 102 by wireless and/or wired communication for providing operative control of the inverters 102 and/or monitoring the inverters 102 (e.g., receiving performance data from the inverters 102); for example, the inverters 102 and the main controller 206 may communicate using PLC, via the bus 208. The inverters 102 are further coupled to the load center 210 via the bus 208.

The inverters 102 convert the DC power from the DC power sources 130 to AC output power and couple the generated output power to the load center 210 via the bus 208. The generated power is coupled from the load center 210 to a commercial power grid.

Each of the inverters 102 comprises an integrated EMC filter/PLC interface 124 and a PLC interface buffer 126 (e.g., the inverter 102-1 comprises the integrated EMC filter/PLC interface 124-1 and the interface buffer 126-1) for filtering generated AC power and coupling PLC signals to and/or receiving PLC signals from bus 208 as previously described with respect to FIG. 1.

Figure 3:
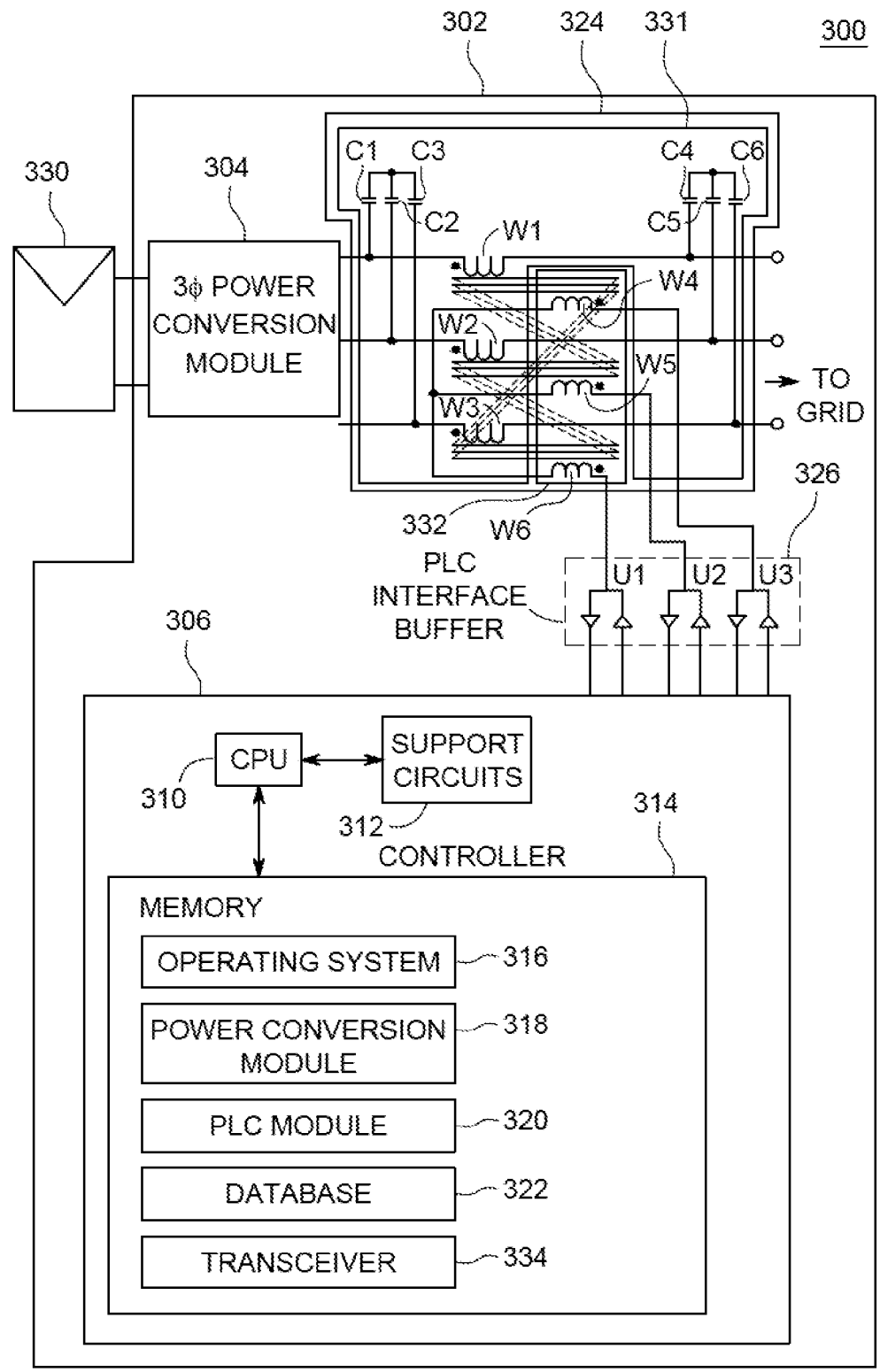
FIG. 3 is a functional block diagram of a power generation system in accordance with exemplary embodiments of the present invention.

FIG. 3 is a functional block diagram of a power generation system in accordance with exemplary embodiments of the present invention.

The power generation system 300 comprises one or more DC power sources 330 coupled across a DC-AC inverter 302. The DC power sources 330 may be any suitable source of DC power, such as a renewable source (e.g., one or more of photovoltaic (PV) modules, wind farms, hydroelectric systems, or the like), batteries, or the like. The inverter 302 converts the DC power to commercial power grid compliant AC output power and couples the generated output power to the commercial power grid ("the grid"). The generated output power may also be stored for later use, for example, using batteries, heated water, hydro pumping, $H_2O$-to-hydrogen conversion, or the like.

The inverter 302 comprises a three-phase power conversion module 304 coupled across the input of an integrated EMC filter/PLC interface 324. The integrated electromagnetic compatibility (EMC) filter and power line communication (PLC) interface 324 is coupled to a PLC interface buffer 326 and across the AC output of the inverter 302. The power conversion module 304 and the PLC interface buffer 326 are coupled to a controller 306, which is functionally similar to controller 106 shown in FIG. 1.

The power conversion module 304 is controlled by the controller 306 and converts a DC input from the DC power sources 330 to AC power that is coupled to the inverter AC output via the integrated EMC filter/PLC interface 324.

The controller 306 may be comprised of hardware, software, or a combination thereof, and comprises at least one central processing unit (CPU) 310 coupled to support circuits 312, transceiver 334 and memory 314. The CPU 310 may comprise one or more conventionally available microprocessors, microcontrollers and the like, which are capable of performing the processing described herein; in some embodiments, the CPU 310 may be a microcontroller comprising internal memory for storing controller firmware that provides the functionality described herein. Alternatively, the CPU 310 may include one or more application specific integrated circuits (ASICs). The support circuits 312 are well known circuits that facilitate the functionality of the CPU 310. Such circuits include, but are not limited to, a cache, power supplies, clock circuits, buses, network cards, input/output (I/O) circuits, and the like. According to some embodiments, the controller 306 is implemented using a general purpose computer that, when executing particular software, becomes a specific purpose computer for performing various embodiments of the present invention. The transceiver 334 is coupled to the PLC interface buffer 326 for PLC communication.

According to some embodiments, the memory 314 comprises random access memory, read only memory, removable disk memory, flash memory, and various combinations of these types of memory. The memory 314 is sometimes referred to as main memory and may, in part, be used as cache memory or buffer memory. The memory 314 generally stores the operating system (OS) 316 of the controller 306. The OS 316 may be one of a number of commercially available OSs such as, but not limited to, Linux, Real-Time Operating System (RTOS), and the like.

The memory 314 may store various forms of application software, such as a conversion control module 318 for providing operative control of the power conversion module 304 and driving the power conversion module 304 to inject the generated AC current into the grid as required by the relevant standards. The memory 314 further stores a power line communication (PLC) module 320 for enabling power line communications over a commercial power grid. The memory 314 further stores a database 322 for storing data, such as data related to operating the power conversion module 304, power line communications, and the like.

The integrated EMC filter/PLC interface 324 comprises a first capacitor C1, a second capacitor C2 and a third capacitor C3 coupled respectively across first terminals of windings W1, W2 and W3 on a common mode choke, where the windings W1, W2 and W3 are further coupled at second terminals respectively across capacitor C4, C5 and C6 to form an EMC filter 331. The EMC filter 331 provides common mode filtering where electromagnetic interference noise is suppressed by filtering in accordance with relevant standards by filtering out common-mode currents, i.e., those currents flowing in the same direction. W1, W2 and W3 are three windings on a conventional three-phase common-mode choke. The integrated EMC filter/PLC interface 324 further comprises additional windings W4, W5 and W6, wound in a bi-filar fashion with respect to windings W1, W2 and W3, where W4, W5 and W6 provide a PLC interface 332 for power line communication via the inverter AC output. Accordingly, the windings W1, W2 and W3 perform EMI filtering, while windings W4, W5 and W6 are used for PLC.

The number of turns on windings W1, W2 and W3 are all equal. The number of turns on W4, W5 and W6 are also equal. However, the number of turns on windings W1, W2 and W3 can differ from the number of turns on windings W4, W5 and W6. Windings W1, W2, & W3 are phased such that the magnetic flux generated within the core is canceled out, i.e., it is wound as a "common mode" choke. Windings W4, W5, & W6 are configured in accordance with the phasing of the PLC drive signals being generated by the PLC interface buffer 326 such that the flux adds up to create a resultant flux (vector) that is in proportion to the PLC drive signal.

The number of turns for each of windings W1, W2 and W3 (i.e., the number of turns on each of the windings of the EMC filter 331), which are equal to one another, may vary depending on the size of the inverter 302 and the switching frequency employed, but generally are between 10 turns to 100 turns. The number of turns for each of windings W4, W5 and W6 (i.e., the number of turns on each of the two windings for the PLC interface 332), which are equal to one another, may be similar, in some embodiments, to the number of turns for windings W1, W2 and W3 (e.g., from 10 to 100) but are not required to be. The relative ratio of the number of turns for the EMC filter 331 and the PLC interface 332 can be independently adjusted according to the independent needs borne out of EMC filter performance and PLC signaling performance.

The three ends of the windings W4, W5 and W6 are coupled to the PLC interface buffer 326 which comprises three bi-directional buffers U1 and U2, i.e., the end of winding W4 is coupled to the bidirectional buffer U3, the end of W5 is coupled to the bi-directional buffer U2, and the end of W6 is coupled to buffer U1. The PLC interface buffer 326 can drive PLC communication or alternatively receive PLC communication via the grid.

In some embodiments, the PLC interface buffer 326 is referenced to ground of the inverter 302. In such embodiments, if the common-mode choke windings W1, W2 and W3 are enamel insulated "magnet wire", a safety-rated isolation is employed between the windings W4, W5 and W6 and the windings W1, W2 and W3, such as using "triple insulated wire" for the winding W4, W5 and W6.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is defined by the claims as follows.

The invention claimed is:

1. An integrated electromagnetic compatibility (EMC) filter and power line communication (PLC) interface, comprising:
   a first filter winding and a second filter winding configured as a common mode choke; and
   a two-part winding wound on the same core as the common mode choke, wherein the two-part winding comprises (i) a first winding coupled proximate the first filter winding; and (ii) a second winding coupled proximate the second filter winding, wherein the first winding and the second winding have an equal number of turns, and wherein phasing of the first winding is reversed with respect to the second winding.

2. The integrated EMC and PLC interface of claim 1, wherein the equal number of turns ranges from 10 to 100 turns.

3. The integrated EMC and PLC interface of claim 1 wherein a number of turns for the first filter winding, second filter winding, the first winding, and the second winding are equal.

4. The integrated EMC and PLC interface of claim 1 wherein a number of turns of each of the first and second filter windings is independent of a number of turns of each of the first and second windings.

5. The integrated EMC and PLC interface of claim 4, wherein the number of turns of each of the first and second filter windings is based on EMC performance.

6. The integrated EMC and PLC interface of claim 4, wherein the number of turns of each of the first and second filter windings is based on PLC performance.

7. The integrated EMC and PLC interface of claim 1 wherein the first and second windings are coupled to a PLC interface buffer.

8. The integrated EMC and PLC interface of claim 7, wherein the PLC interface buffer is referenced to ground.

9. The integrated EMC and PLC interface of claim 8 wherein a safety rated isolation is employed between (a) the first and second filter windings and (b) the first and second windings.

10. The integrated EMC and PLC interface of claim 9 wherein the first and second windings are triple insulated wire.

11. An inverter comprising:
   a power conversion module coupled to a DC power source for converting DC power from the DC power source to AC power;
   an integrated electromagnetic compatibility (EMC) filter and power line communication (PLC) interface, coupled between the power conversion module and an AC output of the inverter, comprising:
      a first filter winding and a second filter winding configured as a common mode choke; and
      a two-part winding on the common mode choke, wherein the two-part winding comprises:
         (i) a first winding coupled proximate the first filter winding; and
         (ii) a second winding coupled proximate the second filter winding, wherein the first winding and the second winding have an equal number of turns, and wherein phasing of the first winding is reversed with respect to the second winding.

12. The inverter of claim 11, further comprising:
   a PLC interface buffer, coupling the PLC interface and a controller, wherein the controller controls the power conversion module.

13. The inverter of claim 12, wherein the PLC interface buffer comprises:
   a first bi-directional buffer; and
   a second bi-directional buffer, wherein the PLC interface buffer performs at least one of driving communication or receiving communication and the PLC interface buffer is referenced to ground of the inverter.

14. The inverter of claim 13, wherein a number of turns for the first filter winding, second filter winding, the first winding, and the second winding are equal.

15. The inverter of claim 13, wherein a number of turns of each of the first and second fitter windings is independent of a number of turns of each of the first and second windings.

16. A power generation system comprising:
   a DC power source; and
   an inverter comprising:
      a power conversion module coupled to the DC power source for converting DC power from the DC power source to AC power,
      an integrated electromagnetic compatibility (EMC) filter and power line communication (PLC) interface, coupled between the power conversion module and an AC output of the inverter, comprising:
         a first filter winding and a second filter winding configured as a common mode choke; and
         a two-part winding on the common mode choke, wherein the two-part winding comprises:
            (i) a first winding coupled proximate the first filter winding; and
            (ii) a second winding coupled proximate the second filter winding, wherein the first winding and the second winding have an equal number of turns, and wherein phasing of the first winding is reversed with respect to the second winding.

17. The system of claim 16, wherein the inverter further comprises:
   a PLC interface buffer, coupling the PLC interface and a controller, wherein the controller controls the power conversion module.

18. The system of claim 17, wherein the PLC interface buffer comprises:
   a first bi-directional buffer; and
   a second bi-directional buffer, wherein the PLC interface buffer performs at least one of driving communication or receiving communication and the PLC interface buffer is referenced to ground of the inverter.

19. The system of claim 18, wherein a number of turns for the first filter winding, second filter winding, the first winding, and the second winding are equal.

20. The system of claim 18, wherein a number of turns of each of the first and second filter windings is independent of a number of turns of each of the first and second windings.

* * * * *